United States Patent [19]

Inoue

[11] 4,302,779
[45] Nov. 24, 1981

[54] METHODS OF REDUCING BLOOMING IN THE DRIVE OF CHARGE-COUPLED IMAGE SENSORS

[75] Inventor: Hidehiko Inoue, Tokyo, Japan

[73] Assignee: Nippon Electric Co., Ltd., Tokyo, Japan

[21] Appl. No.: 155,300

[22] Filed: Jun. 2, 1980

[30] Foreign Application Priority Data

Jun. 6, 1979 [JP] Japan .................... 54-70984

[51] Int. Cl.³ ............... H04N 3/14; H04N 5/30
[52] U.S. Cl. ............................... 358/213
[58] Field of Search ............................ 358/213

[56] References Cited

U.S. PATENT DOCUMENTS

| | | | |
|---|---|---|---|
| 3,715,485 | 2/1973 | Weimer | 358/213 |
| 3,896,474 | 7/1975 | Amelio et al. | 358/213 X |
| 3,996,600 | 12/1976 | Patrin | 358/213 X |
| 4,079,422 | 3/1978 | Anagnostopoulos | 358/213 |

Primary Examiner—Robert L. Richardson
Attorney, Agent, or Firm—Laff, Whitesel & Rockman

[57] ABSTRACT

Signal charges are accumulated in photosensitive elements of an integrated semiconductor imaging matrix, the charges being divided into two parts. Responsive to first and second pulse signals, the first or preceding part of the charge from each of the elements is drawn out via a charge transfer device, as a non-information signal. The second or following part is drawn out, as an information signal, responsive to transfer pulse signals and shift pulse signals. Therefore, even in the presence of intense light, the information signal charges are stored in the photosensitive elements for only a short period of time between the ending time of the first pulse signal and the beginning time of the transfer pulse signal. Thus, the storage will not overflow the capacity of the photosensitive elements. The intensity of light used in this invention is considerably higher than the intensity of light which may be used in the conventional system; therefore, a satisfactory control can be achieved without lowering the sensitivity of the photosensitive elements. It is not necessary to provide charge sinks close to the photosensitive elements for absorbing the signal charge overflowing the elements. As a result, there is a high density of photosensitive elements and a higher resolution of stored information. Alternatively, by designing a wider area of photosensitive elements, an image sensor of higher sensitivity may also be achieved.

12 Claims, 15 Drawing Figures

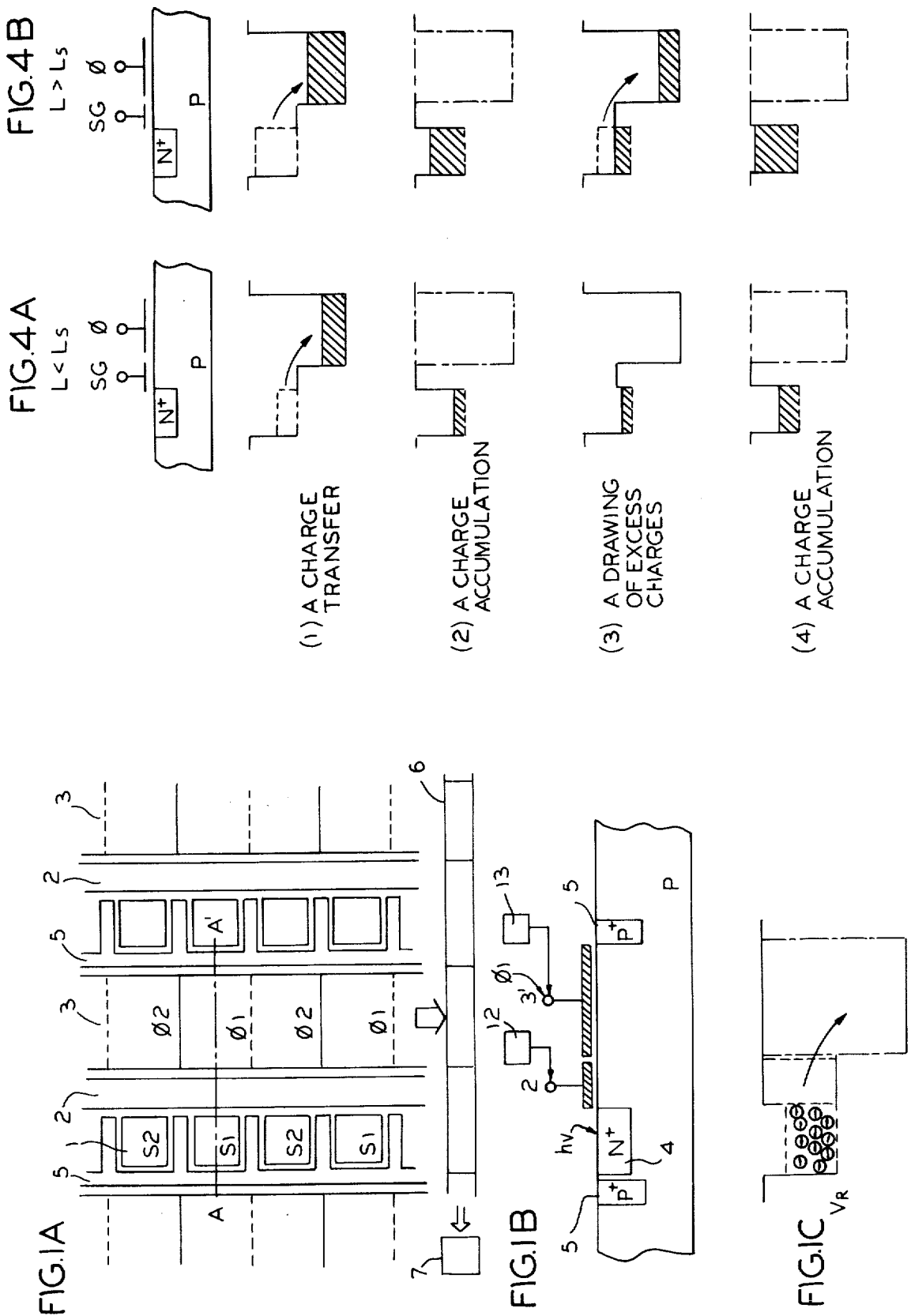

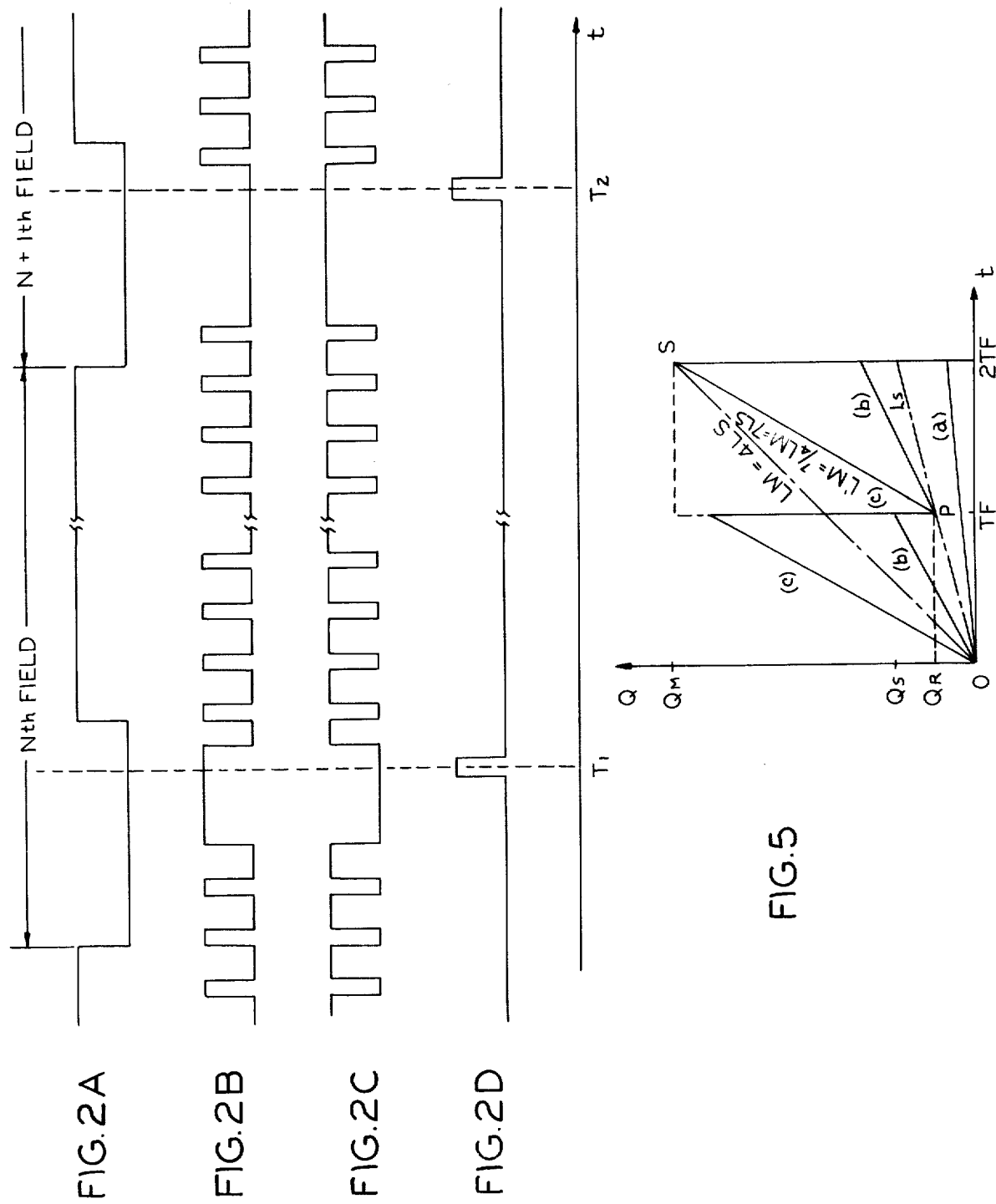

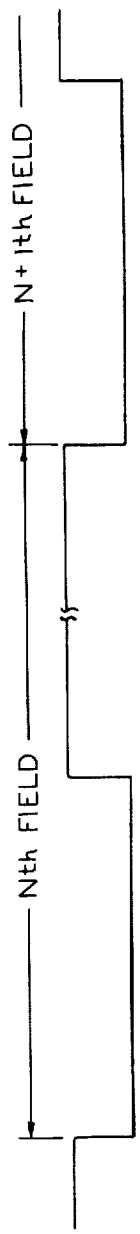
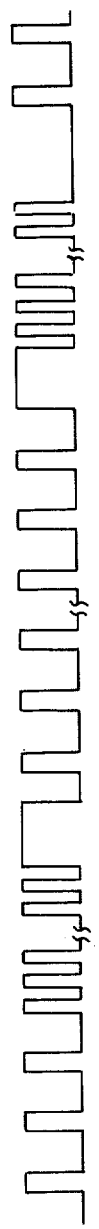
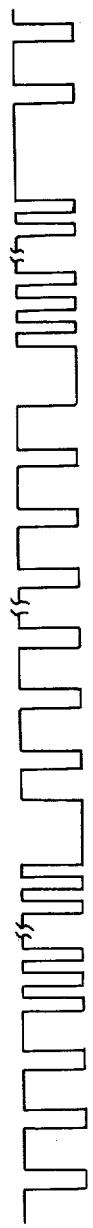
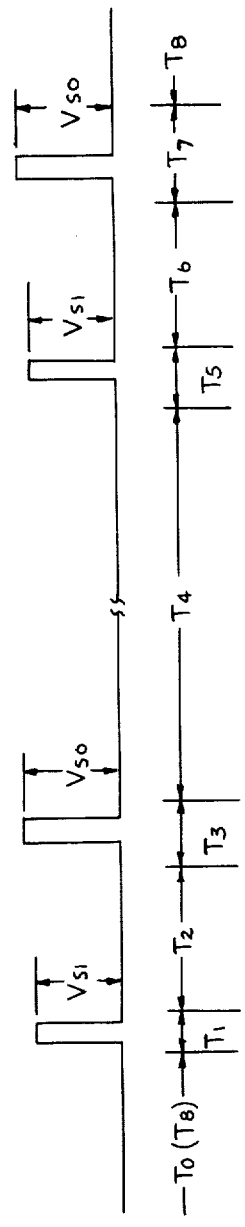
FIG.3A
FIG.3B
FIG.3C
FIG.3D
FIG.6

METHODS OF REDUCING BLOOMING IN THE DRIVE OF CHARGE-COUPLED IMAGE SENSORS

This invention relates methods of driving of a charge coupled image sensor of interline-transfer structures in a manner which improves their characteristics of the device.

Two-dimensional charge-coupled image sensors (hereunder "CCD image sensors") are used in television cameras. Two types have been proposed. One type is a frame-transfer structure (hereunder "frame-transfer CCDs") and the other is an interline-transfer structure (hereunder "interline-transfer CCDs"). As is well known, the notable difference between these two types of CCD image sensors is that the frame-transfer CCD has a photosensitive section composed of photosensitive CCDs for producing and accumulating charges in proportion to the incident light. A storage section, composed of CCDs, for temporarily stores the charges transferred from the photosensitive section. The interline-transfer CCD has a photosensitive section composed of many photo-electric converters, such as photo diodes arranged in rows and columns, and CCD charge shift registers for transferring the charges accumulated in the photosensitive section to a charge-voltage converter. Each of the CCD charge shift registers is associated with the respective columns of the photo-electric converters.

In comparison with a camera tube, such as a silicon vidicon, the CCD image sensor has features of a smaller size, lighter weight, smaller geometrical distortion and shorter lag, and lower power consumption. On the other hand, it has drawbacks because it has lower sensitivity to blue light and a considerable degree of blooming.

"Blooming" is a phenomenon which occurs, when the image has a high-brightness and is formed through a lens focused on the CCD image sensor. Photoelectrons are generated in a great quantity in the photosensitive area corresponding to the high-brightness area. These electrons extend their effect into the area other than that high-brightness area. For example, if a solid-state CCD image sensor takes a picture of an object shining in a dark scene and the image is thereafter reproduced on a cathode-ray tube, the high-brightness area appears to be wider than it would be in the absence of blooming; or, a vertical white line or stripe may extend from that area. In this manner, blooming causes an appreciably deteriorated image.

Such an expanded, high-brightness area is also observed in a camera tube, particularly in a silicon vidicon employing a targetting material made of silicon. However, the vertical white line or stripe extending from the high-brightness area is unique to the CCD image sensor.

Blooming appears in both the frame-transfer CCD and in the interline-transfer CCD. For the frame-transfer CCD, several methods have been proposed for reducing the blooming have been proposed, as in Japanese Patent Publication After Examination published under No. 39211/78 and Japanese Patent Publication before Examination published under No. 142908/76. Here the blooming is suppressed by a use of special CCD driving techniques. But these methods cannot be applied to the interline-transfer CCD whose construction differs greatly from the frame-transfer CCD. Accordingly, attempts have been made to suppress the blooming by only modifying its structure. In particular, overflow drains are placed close to the photosensitive elements for absorbing excess photoelectrons. In this modification, to prevent a decrease in photosensitivity, the dimension of each picture element must be increased by the dimension of the overflow drain, and the use of many picture elements results in a chip of greater size; hence, there is a lower chip yield. On the other hand, to avoid the increase in the dimensions of a picture element, the photosensitive area must be made smaller and this results in lower photosensitivity.

Therefore, a primary object of the present invention is to provide a method of driving an interline-transfer CCD image sensor. The blooming is prevented and an extended range of operating quantity of light (hereunder referred to as a "dynamic range") is provided.

This invention provides a method of driving a two-dimensional charge transfer device which comprises a two-dimensionally arrangement of photo-sensitive elements. Each of a plurality of vertical charge transfer registers is individually associated with a column of the photosensitive elements. A single row forms a horizontal transfer register associated with these vertical charge transfer registers. A transfer gate electrode controls the transfer of the signal charges accumulated in the photosensitive elements. First and second pulsive signals are generated for deriving, from the two-dimensional charge transfer device, the signal charges accumulated in the photosensitive elements during a predetermined signal charge accumulating period. The first pulsive signal is superimposed on a transfer pulsive signal applied to the transfer gate electrode for transferring, to the vertical charge transfer registers, the charges accumulated in the photosensitive elements during a part of the charge accumulating period. The second pulsive signal is superimposed on a shift pulsive signal applied to the vertical charge transfer registers for transferring along the vertical charge transfer registers, the charges transferred from the photosensitive elements responsive to the first pulsive signal in order to derive a non-information signal.

According to this invention, the signal charges accumulated in the photosensitive elements are divided into two parts. The first part is drawn out of the charge transfer device as a non-information signal responsive to the first and the second pulsive signals. The following part is drawn out as an information signal responsive to the transfer pulsive signal and the shift pulsive signal. The signals charges drawn out as an information signal are charges accumulated in the photo-sensitive elements for only a short period of time between the ending of the first pulsive signal and the beginning of the transfer pulsive signal. Such a short storage time does not overflow the photosensitive elements to cause blooming.

The invention enables the intensity of light that causes blooming to be considerably higher, as compared with the intensity which causes blooming in conventional systems. A satisfactory anti-blooming control can be achieved without lowering the sensitivity of the photosensitive elements. As a further advantage, this invention prevents blooming by use of a special method for driving the charge transfer device. Therefore, any suitable kind of structure can be employed as the charge transfer device. In particularly, it is not necessary to provide charge sinks close to the photosensitive elements, for absorbing the signal charge overflowing the elements. As a result, there may be a high density of photosensitive elements and a higher resolution. Alternatively, by designing wider areas of photosensitive elements, an image sensor of higher sensitivity may be achieved.

The above and further objects, features and advantages of this invention will become more apparent from the following detailed description taken in conjunction with the accompanying drawings, wherein:

FIGS. 1(A), 1(B) and 1(C) illustrate a partial plan view, a cross-sectional view, and a graphical representation of the potential state of a charge transfer device, to which the present invention may be applied;

FIGS. 2(A) to 2(D) represent waveforms for driving the charge transfer device in the conventional technique;

FIGS. 3(A) to 3(D) represent waveforms that illustrate the present invention;

FIGS. 4(A) and 4(B) illustrate the states of potential wells for explaining the sequences of the operation of the present invention; and FIGS. 5 and 6 illustrate the relationships between the quantity of charges versus time and between the quantity of charges and the light intensity, for explaining the operation of a preferred embodiment of the present invention.

One example of a charge transfer device, to which the driving method of the present invention is applicable, is an interline-transfer CCD using photodiodes as photosensitive elements and is described in Japanese Patent Publication Before Examination published, under the No. 32693/77. The basic operation of this CCD is now explained by making reference to FIGS. 1(A) and 1(B).

FIG. 1(A) shows a partial, enlarged view of the photosensitive section and vertical transfer section of the interline-transfer CCD, driven by a two-phase clock signal. This interline-transfer CCD is formed on a P-type silicon substrate. A plurality of photosensitive elements 1 are made of N+ type diffusion regions, formed on the P-type semiconductor substrate, and arranged in rows and columns. These photosensitive elements 1 are made discrete by being surrounded by a P+ type channel stopper, diffusion region 5, except where they face a transfer gate electrode 2.

The photosensitive elements 1 in the same column are arranged so that signal charges are drawn to the vertical charge transfer register 3, under the transfer gate electrode 2, with two adjacent elements operating at different times. Those elements from which signal charges are drawn at one time are identified by $S_1$ and those from which signal charges are drawn at a different time are identified by $S_2$. The drawing of the signal charges from these photosensitive elements 1 is controlled by clock pulses and transfer pulses. The clock pulses $\phi_1$ and $\phi_2$ generated by a pulse are generator 13 (in FIG. 1(B)) and applied to the gate electrodes of a vertical charge transfer registers 3. The transfer pulses are generated by a pulse generator 12 (in FIG. 1(B)) and are applied to the transfer gate electrode 2.

The vertical charge transfer registers 3 are arranged parallel to the columns of the photosensitive elements 1, by means of the transfer gate electrodes 2. The gate electrodes of the vertical transfer registers 3 are associated with the individual photosensitive elements 1, and supplied with the clock pulses $\phi_1$ and $\phi_2$, alternately. If a transfer pulse is applied to the transfer gate electrodes 2 in the presence of a clock pulse $\phi_1$, signal charges accumulated in the photosensitive elements $S_1$ are sent to the vertical transfer registers 3. Conversely, if a transfer pulse is applied to the transfer gate electrode 2 in the presence of a clock pulse $\phi_2$, signal charges accumulated in the photosensitive element $S_2$ are sent to the vertical transfer registers 3. These gate pulses $\phi_1$ and $\phi_2$ are also used to enable the signal charges transferred to the vertical transfer registers 3 to be transferred along the registers 3. The signal charges transferred along the vertical transfer registers 3 are applied to horizontal register 6 which is disposed perpendicularly to the column of the photosensitive elements 1. After being transferred along the horizontal transfer register 6, the charges are converted into an electrical signal by a charge quantity-voltage converter 7.

FIG. 1(B) illustrates a cross section of FIG. 1 (A) taken on the line A—A' and FIG. 1 (C) shows a potential profile for further illustrating the operation of the CCD.

If a positive voltage $V_S$ is applied to the transfer gate electrode 2 while a positive voltage $V_1$ is being applied to the electrode 3', as the clock pulse $\phi_1$, some of electrons which are the majority carriers in a diffused layer 4 are transferred under the transfer gate electrode 2 to an area under the electrode 3'. Thereupon, the potential $V_R$ of the diffused layer 4 is set to a potential almost equal to the surface potential under the transfer gate electrode 2. When the voltage $V_S$ on the transfer gate electrode 2 becomes zero, the diffused layer 4 is disconnected electrically from the vertical transfer resistors 3 and becomes "floating".

When the diffused layer 4 is floating, it retains a voltage $V_R$ to form a thermally non-equalibrated potential well. If optical information is supplied to the photosensitive elements 1, in this state, pairs of electrons and holes are generated in proportion to the quantity of incident light. Only the electrons are stored in the potential well so that the potential of the diffused layer 4 becomes lower than the potential $V_R$, by a degree corresponding to the accumulated electrons. If a voltage $V_S$ of the transfer gate pulse is applied again to the transfer gate electrode 2, in the presence of the positive voltage $V_1$ applied to the electrode 3, the electrons which have been subjected to a photoelectric conversion and which have been accumulated in the potential well (such electrons will hereunder be referred to as "signal charges") are transferred to an area under the electrode 3' of the vertical transfer register 3.

When the voltage on the transfer gate electrode 2 reaches zero, the electrons which are generated responsive to incident light are again stored in the potential well in the diffused layer 4. At the same time, the signal charges transferred to the right, under the electrode 3' of the vertical transfer registers, 3 during the preceding time when the voltage on the transfer gate electrode 2 was $V_S$, are transferred along the vertical transfer resister 3. This vertical transfer is controlled by the clock pulses $\phi_1$ and $\phi_2$, with transfer in the direction indicated by the downwardly-pointing arrow in FIG. 1 (A). These transfer signal charges are delivered as output signal voltage from the charge quantity/voltage converter 7, responsive to a passage of the signal charges, through the horizontal transfer register 6.

We now describe the mechanism by which the conventional apparatus drives the interline-transfer CCD, as applied to an ordinary television imaging apparatus.

As shown in FIG. 1 (A), this CCD comprises the vertical transfer registers 3 which are driven by two clock pulses ($\phi_1$ and $\phi_2$) having two phases. Registers 3 employ photosensitive elements which are associated with each gate electrode of the vertical transfer registers 3. Therefore, an interlaced driving of the CCD can be achieved by drawing an optical information signal, in an odd number field, from a photosensitive elements associated with the electrodes identified by $\phi_1$ in FIG. 1 (A) (such elements being hereunder referred to as a "photosensitive element $S_1$") and drawing an optical information signal, in the even number field, from a photosensitive element associated with the electrodes identified by $\phi_2$ (such element hereunder referred to as a "photosensitive element $S_2$").

FIGS. 2 (A) to 2 (D) represents waveforms obtained by performing such interlaced drive, in the conventional system. FIG. 2 (A) is the waveform of the vertical blanking signal; FIG. 2 (B) is the waveform of clock pulse $\phi_1$ to be applied to the electrodes identified by $\phi_1$ in FIG. 1 (A) of the vertical transfer registers (C) is the waveform of clock pulse $\phi_2$ to be applied to the electrodes identified by $\phi_2$ in FIG. 1 (A). The $\phi_1$, and $\phi_2$ clock pulses have opposite polarity. FIG. 2 (D) is the waveform of pulses to be applied to the transfer gate electrodes 2.

Consider a time $T_1$ within the vertical blanking period for a certain field (let us call it the N-th field). At this point of time, the clock pulse $\phi_1$ has a positive voltage, and the clock pulse $\phi_2$ is at zero volts. Since the transfer gate electrode 2 has a positive pulse (FIG. 2 (D)) applied thereto, only the signal charges accumulated in the photosensitive element $S_1$ are transferred to the electrodes identified by clock pulses $\phi_1$ of the vertical transfer registers 3. If the transfer gate electrode 2 is no longer supplied with a positive pulse, signal charges begin again to be accumulated in the photosensitive element $S_1$.

At the same time, in response to the clock pulses $\phi_1$ and $\phi_2$ applied to the vertical transfer registers 3, the signal charges transferred to the electrodes identified by clock pulses $\phi_1$ are transferred consecutively in a vertical direction along the vertical transfer register 3 and delivered as an output signal voltage through the horizontal transfer register 6. Upon the transfer of all signal charges from the photosensitive element $S_1$, the voltage on the electrodes identified by clock pulses $\phi_1$ reaches zero. Then, the voltage on the electrodes identified by clock pulses $\phi_2$ assumes a positive value. Such a condition exists in the vertical blanking period of the next field, i.e. N+1 th field. If a positive pulse is applied again to the transfer gate electrode while the voltages are in this described state, only the signal charges accumulated in the photosensitive element $S_2$ are transferred to the electrodes identified by clock pulse. These electrodes are in the vertical transfer register 3. (This condition exists at a time $T_2$).

If the transfer gate electrode 2 is no longer supplied with a positive pulse, signal charges begin again to be accumulated in the photosensitive element $S_2$. At the same time, in response to the clock pulses $\phi_1$ and $\phi_2$, the signal charges that have been transferred from the photosensitive element $S_2$ into regions under the electrodes identified by clock pulse $\phi_2$ from are transferred consecutively along the vertical transfer register 3, with transfer being in a vertical direction. These vertically transferred signals are delivered, as an output signal, through the horizontal transfer register 6. Upon the transfer of all signal charges from the photosensitive element $S_2$, the voltage on the electrodes identified by clock pulse $\phi_1$ assumes a positive value and the voltage on the electrodes identified by clock pulse $\phi_2$ reaches zero. Repeating the above operations gives consecutive television signals.

As will be clear from the above description, signal charges are accumulated in the photosensitive element $S_1$ or $S_2$, during the period of consecutive two fields. Therefore, if the period of one field assumes $T_F$ and the maximum quantity of signal charges that can be processed by this CCD without causing blooming assumes $Q_M$, the maximum intensity of incident light $L_M$ that can be handled by the above-mentioned conventional drive method is given by:

$$L_M = K \cdot \frac{Q_M}{2T_F} \quad (1)$$

Television imaging apparatus generally sets a certain value as a standard signal level, or a standard signal charge quantity $Q_S$. The intensity of incident light for providing such standard signal charge quantity $Q_S$ is referred to as a "standard intensity of incident light". The standard signal charge quantity $Q_S$ varies somewhat with the S/N ratio of the imaging apparatus, but it is usually set at a quarter to half the maximum quantity of signal charge $Q_M$. Suppose its value is a quarter of $Q_M$, then $Q_S$ is given by $\frac{1}{4} \cdot Q_M$.

It is known that the above-mentioned conventional drive system has a photoelectric conversion ratio of an unity. The relationship between charge quantity Q and light intensity L is as indicated by the dot-dash line in FIG. 6, wherein the x-axis represents the intensity of incident light L and the y-axis represents the quantity of signal charge Q. The quantity of signal charge increases as a linear function of the intensity of incident light, until it reaches the maximum quantity of signal charge $Q_M$. Accordingly, the maximum intensity $L_M$ of incident light is $4L_S$ for providing the maximum quantity of signal charge $Q_M$. This means that the television imaging apparatus, driven by the conventional method, has a quadrupled dynamic range. To obtain a further expanded dynamic range, the quantity of the standard signal charge $Q_S$ may be set at an even smaller value. However, to produce the same level of an output signal from the television imaging apparatus with a very small value of $Q_S$, the capacity of the amplifier for the signal processing system must be increased to compensate for the decrease in the standard quantity of signal charge $Q_S$. This increase results in a deteriorated system S/N ratio.

However, as will be described hereinafter, our inventions causes no deterioration in system S/N ratio and an expanded dynamic range. The pulse generators 12 and 13 generate first and second pulsive signals. These pulsive signals draw some of the signal charges accumulated in the photosensitive elements out of the charge transfer device as excess charges or as non-information signal. appears after a predetermined time period expires and is superimposed on a transfer gate pulse, for driving a transfer gate electrode. The second pulsive signal is generated during a time period between the first pulsive signal and the transfer gate pulse and is superimposed on a drive pulsive signal for driving vertical transfer registers. With such design features, the invention provides the charge transfer element with a KNEE characteristic and a wider dynamic range.

One preferred embodiment of the driving method for driving the charge transfer image sensor, according to this invention, is specifically described hereunder with reference to FIGS. 1 (A) to 1 (c) and FIGS. 3 (A) to 3 (D). FIG. 3 (A) represents the waveform of the vertical blanking signal FIG. 3 (B) represents the waveform of clock pulse $\phi_1$ to be applied to the electrodes (identified by $\phi_1$ in FIG. 1 (A)) of the vertical transfer registers 3; FIG. 3 (C) represents the waveform of clock pulse $\phi_2$ to be applied to the electrodes; identified by $\phi_2$, and FIG. 3 (D) represents the waveform of pulses to be applied to the transfer gate electrode 2. A voltage $V_{S1}$ develops during time-periods $T_1$ and $T_5$, and a voltage $V_{S0}$ develops during time-periods $T_3$ and $T_7$.

The difference between this embodiment of this invention and the conventional driving method illustrated in FIG. 2 is that the embodiment of this invention employs a clock pulse train for clearing excess charges within the vertical blanking period. The clock pulse train is superimposed on two clock pulses $\phi_1$ and $\phi_2$, during the periods $T_2$ and $T_6$. Such an clock pulse train has different repetition cycle, as compared to the repetition cycle of the clock pulses $\phi_1$ and $\phi_2$ during the periods $T_0(T_8)$ and $T_4$.

In FIG. 3, optical information is being read in the time-period $T_0$ (N−1 th vertical scanning period), which provides an output signal in response to the signal charges accumulated in the photosensitive element $S_2$ during the period of two fields. At the termination of the period $T_0$, the photosensitive element $S_1$ stores signal charges that have been accumulated during the period of two fields. The photosensitive element $S_2$ stores signal charges that have been stored during the period of one field.

Charges accumulated in the photosensitive elements $S_2$ are transferred to the vertical transfer registers 3 in the timeperiod $T_1$, while the photosensitive elements $S_1$ continues to accumulate charges in response to incident light. Since the voltage on the electrodes identified by $\phi_1$ in FIG. 1 (A) is zero and that on the electrodes identified by $\phi_2$ in FIG. 1 (A) is positive, a potential well exists in only the area directly under the electrodes identified by $\phi_2$ of the vertical transfer registers 3. Upon application of a positive voltage $V_{S1}$ to the transfer gate electrode 2, some of the signal charges accumulated in the photosensitive element $S_2$ are transferred to the vertical transfer registers 3. If the quantity of signal charges accumulated in the photosensitive element $S_2$ during the period of about one field is $Q_F$, the quantity of the charges transferred $Q_0$ is given by the equation $Q_0=Q_F-K'(V_{S0}-V_{S1})$. The second term on the right-hand side represents the quantity of charges which is equivalent to the difference between the two voltages $V_{S1}$ and $V_{S0}$, applied to the transfer gate electrode 2.

The charges which are transferred in the period $T_1$ are cleared in the period $T_2$ by being rapidly transferred along the vertical transfer register 3, to a charge sink at the end of the vertical register which is opposite to the end abutting the horizontal transfer register 6. At the termination of this transfer period, the voltage on the electrodes identified by $\phi_1$ is positive, whereas the voltages on the electrodes identified by $\phi_2$ is zero. Thus, upon application of a positive voltage $V_{S0}$ to the transfer gate electrode 2 during the period $T_3$, all signal charges stored in the photosensitive element $S_1$ are transferred to a potential well formed directly under the electrodes identified by $\phi_1$. At the same time, the potential at the photosensitive element $S_1$ is set to a level substantially equal to the surface potential $V'_{S0}$ developed under the transfer gate electrodes by $V_{S0}$. When the voltage on the transfer gate electrode reaches zero, the photosensitive element $S_1$ starts an accumulation of signal charges.

The signal charges accumulated in the photosensitive element $S_1$ during the period of the N-2 th and N-1 th fields are read in the period $T_4$. At the termination of the period $T_4$, the voltage on the electrodes identified by $\phi_1$ is positive and the voltage on the electrodes identified by $\phi_2$ is zero. Therefore, in the period $T_5$, some of the signal charges accumulated in the photosensitive element $S_1$ during the period $T_4$ are transferred to the vertical register 3. In the period $T_6$. These transferred charges are rapidly transfered along the vertical transfer registers 3 to the charge sink.

The cleared excess charges are not delivered as an output signal, but are discarded at the charge sink or the like. At the termination of the period $T_6$, the voltage on the electrodes identified by $\phi_1$ is zero and that on the electrodes identified by $\phi_2$ is positive; hence, upon application of a positive voltage $V_{S0}$ to the transfer gate electrode 2 in the period $T_7$, all signal charges accumulated in the photosensitive element $S_2$ are transferred to a potential well formed under the electrodes identified by $\phi_2$. At the same time, the potential at the photosensitive element $S_2$ is set to a level which is substantially equal to the surface potential $V'_{S0}$ developed under the transfer gate electrode by $V_{S0}$. When the voltage on the transfer gate electrode 2 reaches zero, the photosensitive element $S_2$ starts the accumulation of signal charges. The signal charges are read in the period $T_8$ (or period $T_0$).

The driving method described in the foregoing is now elaborated by making reference to the potential profiles of FIGS. 4(A) and 4(B). For the sake of clarity, the following description is limited to only the signal charge stored in the photosensitive elements $S_1$. FIG. 4(A) represents the charge stored when the intensity of incident light L is smaller than the intensity of standard set incident light $L_S$, and FIG. 4(B) represents the charge stored when L is larger than $L_S$. On each side of the potential profile, (FIG. 4 (1)), the signal charges stored in the photosensitive elements 1 (N+ region) (FIG. 1) for the period of two fields have just been transferred to the vertical transfer registers 3, via the transfer gate electrode 2. This corresponds to the application of a voltage $V_{S0}$ to the transfer gate electrode 2 in the period $T_3$ in FIGS. 3(A) to 3(D). The potential profile (FIG. 4(2)) shows signal charges being accumulated in the photosensitive element 1 (FIG. 1) while signal charges are being transferred to and read from the vertical transfer registers 3. This corresponds to the node of the period $T_4$ in FIGS. 3(A) to 3(D). The profile (FIG. 4(3)) indicates the mode for clearing any excess charges which have been transferred to the vertical transfer registers 3, when the quantity of the signal charges accumulated in the photosensitive element 1, during the period of about one field exceeds a certain set value. In the profile (FIG. 4(3)) for FIG. 4(A), there are no such excess charges, and in the profile (FIG. 4(3)) for FIG. 4(B), there are excess charges. The period of this mode corresponds to the period $T_5$ in FIGS. 3(A) to 3(D). The quantity of the excess charges to be cleared is set by the voltage $V_{S1}$ which is to be applied to the transfer gate electrode 2 (FIG. 1). Any excess charges are cleared and discarded in the period $T_6$. The profile (FIG. 4(4)) shows charges stored after the excess charges have been transferred to the vertical transfer registers 3 (FIG. 1). The period of this mode corresponds to the periods $T_6$ to $T_8$ ($T_0$). The four modes (1)

to (4) of FIG. 4 make up one cycle of the driving method of this invention.

The driving method according to the present invention is further described by reference to one embodiment. It is used for the purpose of expanding the dynamic range of a television imaging apparatus using an interline-transfer CCD. The interline-transfer CCD used therein is a two-phase driven CCD the construction of which is already shown in FIGS. 1(A) and 1(B). The signal waveforms for driving the CCD are also shown in FIGS. 3(A) to 3(D).

What is important here is the level of $V_{S1}$, one of the two pulsive voltages to be applied to the transfer gate electrode 2 shown in FIG. 3(D). It will be clear from the foregoing description that there is no difference at all from the conventional driving method in the point of the dynamic range of CCD, if that voltage is set at zero volts.

If voltage $V_{S1}$ is equal to voltage $V_{S0}$, all signal charges accumulated in the period of one field are cleared as excess charges. Accordingly, the intensity of incident light L, which can be handled, is twice as much as can be handled in the conventional driving method; hence, the dynamic range of the system is doubled. However, the output signal charges comprise only those which have been accumulated in the period of the remaining one field and the sensitivity obtained is reduced to half.

Therefore, to provide a wider dynamic range, without losing sensitivity when the intensity of the incident light is lower than the standard intensity $L_S$, the voltage $V_{S1}$ is set at a level equal to $\frac{1}{8} \cdot V_{S0}$, according to one embodiment of this invention. FIG. 5 shows the relationship between the storing period t and the quantity Q of the signal charge, as obtained when the driving method of this invention is implemented according to such embodiment. The solid lines (a), (b) and (c) in FIG. 5 represent the following cases, respectively: $L < L_S$, $L_S < L < 7L_S$, and $L = 7L_S$. In FIG. 5, level $Q_M$ represents the maximum quantity of charges that can be handled by the interline-transfer CCD; level $Q_S (= \frac{1}{2} \cdot Q_M)$ is the standard quantity of signal charges. It ($Q_S$) is the quantity of signal charges stored in the period of two fields (i.e. from 0 to $2T_F$) with the standard intensity of incident light $L_S$. Level $Q_R$ is a threshold quantity of charges for excess charges (i.e. any of the charges stored during the period of one field from 0 to $T_F$ and charges exceeding $Q_R$ are to be cleared). This threshold quantity is determined by the voltage of $V_{S1}$. Since $V_{S1}$ is set at a level equal to $\frac{1}{8} \cdot V_{S0}$ according to the embodiment under discussion, $Q_R = \frac{1}{8} \cdot Q_M = \frac{1}{4} \cdot Q_S$. Therefore, if the quantity of the signal charges accumulated in a photosensitive element in the period of one field is greater than a half of the standard quantity $Q_S$ of signal charges, those signal charges which are in excess of $\frac{1}{4} \cdot Q_S$ are cleared and discarded at a given time (point P in FIG. 5) which is in the vertical blanking period. This discord leaves only a quantity of charges less than $\frac{1}{4} \cdot Q_S$, before the signal charges start again to be accumulated in the period of the next succeeding field from $T_F$ to $2T_F$ (as indicated by the lines (b) and (c) in FIG. 5).

Therefore, the maximum intensity of incident light $L'_M$ that can be handled in the embodiment being discussed is given by the slope of the straight line connecting points P and S in FIG. 5 which is expressed by the following equation:

$$L_{M'} = K \cdot \frac{Q_M - Q_R}{T_F} \qquad (2)$$

Since $Q_R$ is $\frac{1}{8} \cdot Q_M$, this equation can be rewritten as:

$$L_{M'} = K \cdot \frac{7}{8} \cdot \frac{Q_M}{T_F} = \frac{7}{4} \cdot K \cdot \frac{Q_M}{2T_F}$$

Since $K \cdot Q_M / 2T_F$ in this equation is the maximum intensity $L_M$ of incident light that is obtained in the conventional driving method (see equation (1)), equation (2) can be rewritten as:

$$L_{M'} = \frac{7}{4} \cdot L_M$$

This means that the invention provides a dynamic range which is 7/4 times as wide as that which is obtained in the conventional driving method. In terms of a television imaging apparatus, the dynamic range is septupled.

The solid line in FIG. 6 represents the photoelectric conversion characteristic curve obtained in the embodiment of this invention. The portion of the line between 0 and $L_S$ (intensity of incident light) has a different slope than the portion extending from $L_S$ to $7L_S$, thereby providing a KNEE characteristics.

Therefore, the driving system of this invention achieves a suppression or prevention of blooming, without sacrificing the sensitivity of the photosensitive elements used. What is more, this suppression is accomplished by a special driving method rather than by a modification of the construction of the imaging device. Thus, it is easy either to have more photosensitive elements packed more closely and to provide a higher resolution, or to provide a higher sensitivity by using photosensitive elements of larger area.

The method of clearing excess charges by use of a charge sink is illustrated as an example in the foregoing description. Excess charges may be also cleared by transferring them along the horizontal transfer register in the same manner that signal charges are transferred when they are read but eliminating the output obtained from the horizontal transfer resistor.

Also, the foregoing description has assumed an interline-transfer CCD which uses photodiodes as photosensitive elements. However, it should be understood that the driving method of this invention is applicable to a CCD image sensor using MOS photosensitive elements. The difference between the photodiode and MOS photosensitive element is that the reference potential of a potential well in the photodiode is determined by the voltage applied to the transfer gate electrode (as has been described above). Whereas, in the MOS photosensitive element, such a reference potential is determined by the voltage applied directly to the element. Therefore, by selecting suitable values for the voltage applied directly to the photosensitive element and for the voltage applied to the transfer gate electrode, the same result that is produced by the use of a photodiodes can be obtained by using MOS photosensitive elements in a CCD image sensor.

As will be clear from the above description, the driving system of this invention can drive a interline-transfer CCD over a wide dynamic range without decreasing its photosensitivity.

What is claimed is:

1. A method for driving a charge transfer imaging device comprising a plurality of photosensitive elements arranged in at least a row, said photosensitive elements accumulating charges in response to incident light falling on them, transfer register means disposed in parallel to said row of photosensitive elements, and transfer gate electrode means for supplying said transfer register means with said charges accumulated in said photosensitive elements, means responsive to the end of a predetermined time period which is part of the charge-accumulating period for applying a first signal to said transfer gate electrode to supply said transfer register means with at least a part of the charges accumulated in said photosensitive elements in said predetermined time period, means effective after the end of said first signal for applying a second signal to said transfer register means to transfer along said transfer channel said at least a part of charges supplied to said transfer register means, means effective after said charge-accumulating period has elapsed for applying a third signal to said transfer gate electrode to supply said transfer register means with information charges accumulated in said photosensitive elements and including charges accumulated in the period subsequent to said predetermined time period, and means effective after said third signal disappears for applying a fourth signal to said transfer register means to transfer along said transfer register means said information charges to produce an output electrical signal according to said information charges.

2. A method for driving a two-dimensional charge transfer imaging device comprising a plurality of photosensitive elements arranged in rows and columns for accumulating charges in response to incident light, a plurality of said rows of first transfer register means having charge transfer elements, each of said transfer register means being associated with an individually associated one of said columns of said photosensitive elements, transfer gate electrode means for supplying said first transfer register means in response to voltages applied thereto with said charges being accumulated in said photosensitive elements, each of said photosensitive element means being disposed between said column of said photosensitive elements and said first transfer register means, a second transfer register means using charge transfer elements for receiving charges transferred along said first transfer register means, and output means for converting said charges transferred along and second transfer register means; means responsive to the end of a predetermined time period which is part of a charge-accumulating period for applying a first signal to said transfer gate electrodes to supply said first transfer register means with at least a part of the charges accumulated in said photosensitive elements during said predetermined period, means responsive to the end of said first signal for applying a second signal to said first transfer registers means to transfer at least said part of the charges along said first transfer register means to said first transfer register means, means responsive to the end of the charge-accumulating period for applying a third signal to said transfer gate electrodes to supply said first transfer register means with information charges accumulated in said photosensitive elements and including charges accumulated during the period subsequent to said predetermined time period, and means for applying a fourth signal to said first transfer register means to transfer said information charges along said first transfer register means to said output means to produce an output electrical signal according to said information charges transferred via said second transfer register means.

3. A driving method according to claim 1 wherein said at least part of said charge disappears after it has been transferred along said first transfer register means.

4. A driving method according to claim 2 wherein said at least part of said charges disappear after it has been transferred along said first transfer register means.

5. A driving method according to claim 2 or 4 and means wherein the charges accumulated in every other one of said photosensitive elements in the same column during one charge accumulating period are transferred as at least a part of said charges along said first transfer register means in response to said first and second signals, means wherein the charges stored in the other photosensitive elements during said one charge-accumulating period are transferred as said information charges along said first transfer register means in response to said third and fourth signals, means wherein the charges stored in said other ones of the photosensitive elements during a charge-accumulating period subsequent to said one charge accumulating period are transferred as at least said part of charges which are transferred along said first transfer register means in response to said first and third signals, and means wherein the charges accumulated in every other one of said photosensitive elements during said subsequent charge-accumulating period are transferred along said first transfer register means in response to said first and second signals.

6. A method for driving a two-dimensional charge transfer imaging device comprising a plurality of columns of vertical transfer register means using charge transfer elements associated into rows and columns of two-dimensionally disposed photosensitive elements, a horizontal transfer register means associated with the ends of said vertical transfer registers, and transfer gate electrode means for supplying the signal charges accumulated in said photosensitive elements to said vertical transfer registers, means for generating first and second pulsive waves within a predetermined time which is part of the charge-accumulating period, said pulsive waves being some of the charges accumulated in said photosensitive elements, said first pulsive wave being superimposed on a transfer pulsive wave for driving said transfer gate electrode to enable a transfer of charges from said photosensitive elements to said vertical transfer register means, and the second pulsive wave being superimposed on a shift pulsive wave for driving said vertical transfer registers to transfer the charges along said vertical transfer register means.

7. An integrated, photoactivated, semiconductor signal charge accumulation and transfer system comprising a plurality of photosensitive elements for accumulating charges divided into at least two parts, a plurality of charge transfer means associated with said photosensitive elements, means responsive to a first part of the divided charge for drawing out said first part of said charges via a charge transfer means, as a non-information signal, means for drawing out a second and following part of the divided charges as an information signal, means for controlling said drawing out of said second charge parts responsive to transfer pulse signals and shift pulse signals, said information signal said part of said charges being stored even in the presence of intense light in the photosensitive elements for only a short period of time between the ending time of the first pulse signal and the beginning time of the transfer pulse signal.

8. An integrated, photoactivated, semiconductor imaging device comprising a matrix of photosensitive elements, an output signal generating means, means for grouping said elements into a plurality of operating units, means associated with each of said groups of said elements for transferring charges from individual ones of said elements to said output signal generating means, means for dividing each of said transfer charges into two parts, one of said parts being information signals and the other of said parts being non-information signals, means responsive to said information parts of said transfer charges for generating a plurality of output electrical signals, and means for dissipating the non-information parts of said transfer charges.

9. The device of claim 8 wherein said matrix is a plurality of said photosensitive elements arranged into rows and columns, each column of said photosensitive elements forming one of said groups of elements, and said charge transfer means is a vertical shift register adjacent each column of said matrix, means for gating charges from individual ones of said photosensitive elements into the adjacent vertical shift register, and means for operating said gating means in a two-step cycle for dividing each of said transferred charges into said two parts.

10. The device of claim 9 and means for scanning the rows of said matrix in two phases, whereby charge transfers from odd and even lines in said matrix interleave.

11. The device of either one of the claims 9 or 10 and horizontal shift register means coupled to one end of each of said vertical shift register means for receiving said part being an information signal, and said dissipating means comprises means coupled to the other end of each of said vertical shift register means.

12. The device of any one of the claims 9, 10 or 11 and means for operating said means for transferring charges on a four-step cycle comprising: (a) transfer a first part of the charges from said photosensitive elements to a gate electrode, (b) transfer said first part of charges from said gate electrode to a transfer channel, (c) transfer subsequent charges to said gate electrode, and (d) transfer said subsequent charges to said means for generating said output signal.

* * * * *

UNITED STATES PATENT AND TRADEMARK OFFICE
CERTIFICATE OF CORRECTION

PATENT NO. : 4,302,779
DATED : November 24, 1981
INVENTOR(S) : HIDEHIKO INOUE

It is certified that error appears in the above—identified patent and that said Letters Patent is hereby corrected as shown below:

Col. 4, Line 51, after "registers", ",3" should be --3,--;

Col. 5, Line 16, after "registers", insert --; and Fig. 2--;

Col. 5, Line 50, after "pulse", insert --$\phi_2$--;

Col. 5, Line 59, after "$\phi_2$" delete "from";

Col. 6, Line 57, after "signal." insert --The first pulsive signal--;

Col. 7, Line 3, after "signal", insert --.--;

Col. 8, Line 11, after "$T_6$" delete "." and change "These" to --these--;

Col. 9, Line 33, "1/3." should be --7/8.-- .

Signed and Sealed this

Fifteenth Day of June 1982

[SEAL]

Attest:

GERALD J. MOSSINGHOFF

Attesting Officer     Commissioner of Patents and Trademarks